(12) United States Patent
Chicarella et al.

(10) Patent No.: US 8,323,759 B2
(45) Date of Patent: Dec. 4, 2012

(54) LIGHTER THAN AIR BALLOON MADE FROM A BIAXIALLY ORIENTED POLYESTER FILM

(75) Inventors: Gianfranco Chicarella, North Providence, RI (US); Nao Yokota, Saunderstown, RI (US); Tracy A. Paolilli, East Greenwich, RI (US); John J. Fitch, Middletown, RI (US); Todd Richard Sarnstrom, Ellsworth, WI (US); Dean Borchardt, River Falls, WI (US); Paul Andrew Ansolabehere, Minnetonka, MN (US); Steven Sargeant, Kingston, RI (US)

(73) Assignee: Toray Plastics (America), Inc., North Kingstown, RI (US)

( * ) Notice: Subject to any disclaimer, the term of this patent is extended or adjusted under 35 U.S.C. 154(b) by 0 days.

(21) Appl. No.: 13/196,554

(22) Filed: Aug. 2, 2011

(65) Prior Publication Data
US 2011/0287200 A1    Nov. 24, 2011

Related U.S. Application Data

(60) Division of application No. 12/202,655, filed on Sep. 2, 2008, which is a continuation-in-part of application No. 11/651,103, filed on Jan. 9, 2007, now Pat. No. 7,799,399.

(60) Provisional application No. 60/811,410, filed on Jun. 7, 2006.

(51) Int. Cl.
*B32B 1/02*    (2006.01)
*B32B 23/00*    (2006.01)

(52) U.S. Cl. ............ 428/35.7; 428/34.1; 428/34.2; 428/35.9; 428/36.91

(58) Field of Classification Search ............ 428/34.1, 428/34.2, 35.7, 35.9, 36.9
See application file for complete search history.

(56) References Cited

U.S. PATENT DOCUMENTS

| | | |
|---|---|---|
| 3,903,294 A | 9/1975 | Abella |
| 4,011,358 A | 3/1977 | Roelofs |
| 4,077,588 A | 3/1978 | Hurst |
| 4,290,763 A | 9/1981 | Hurst |

(Continued)

FOREIGN PATENT DOCUMENTS

JP    07-268189    10/1995
(Continued)

OTHER PUBLICATIONS

Sargeant et al., U.S. Office Action mailed Jun. 27, 2007, directed to U.S. Appl. No. 11/651,103; 10 pages.

(Continued)

*Primary Examiner* — Marc Patterson
(74) *Attorney, Agent, or Firm* — Morrison & Foerster LLP (57) ABSTRACT

A long life balloon formed from a lamination. The lamination includes a polyester film with a total thickness of 4 μm to 12 μm. The polyester film includes a biaxially oriented polyester core layer and at least one amorphous copolyester skin layer. The lamination also includes a sealant layer and a gas barrier layer on an opposite side of the polyester film from the sealant layer. The oxygen transmission rate of the balloon is less than 0.1 cc/100 sqin/day, a bonding strength of the gas barrier layer to the surface of the polyester film is more than 300 g/in at dry conditions, a sealing strength of the balloon is more than 3.5 kg/in, and a floating time of the balloon is more than 20 days.

14 Claims, 5 Drawing Sheets

U.S. PATENT DOCUMENTS

| | | | |
|---|---|---|---|
| 4,322,003 A | | 3/1982 | Long |
| 4,375,494 A | | 3/1983 | Stokes |
| 4,636,442 A | | 1/1987 | Beavers et al. |
| 4,704,325 A | | 11/1987 | Crocker |
| 4,778,431 A | | 10/1988 | Dudley |
| 4,917,646 A | | 4/1990 | Kieves |
| 5,108,339 A | | 4/1992 | Kieves |
| 5,145,833 A | * | 9/1992 | Prunier et al. ............... 505/491 |
| 5,164,248 A | | 11/1992 | Fleury et al. |
| 5,209,972 A | | 5/1993 | Super et al. |
| 5,338,243 A | | 8/1994 | Kieves |
| 5,458,965 A | | 10/1995 | Yoshinaka et al. |
| 5,616,496 A | | 4/1997 | Frost et al. |
| 5,713,777 A | | 2/1998 | Greenwald |
| 5,770,301 A | * | 6/1998 | Murai et al. ............... 428/213 |
| 5,853,862 A | | 12/1998 | Murai et al. |
| 5,856,017 A | | 1/1999 | Matsuda et al. |
| 5,882,747 A | | 3/1999 | Bria et al. |
| 5,942,320 A | | 8/1999 | Miyake et al. |
| 5,958,552 A | | 9/1999 | Fukuda et al. |
| 6,103,368 A | | 8/2000 | Fukuda et al. |
| 6,194,054 B1 | | 2/2001 | Peiffer et al. |
| 6,214,440 B1 | | 4/2001 | Peiffer et al. |
| 6,221,191 B1 | | 4/2001 | Davis et al. |
| 6,291,053 B1 | | 9/2001 | Peiffer et al. |
| 6,391,410 B1 | | 5/2002 | Peiffer et al. |
| 6,436,544 B1 | | 8/2002 | Veyrat et al. |
| 6,543,208 B1 | | 4/2003 | Kobayashi et al. |
| 6,607,815 B2 | | 8/2003 | Bartsch et al. |
| 6,743,512 B2 | | 6/2004 | Murata et al. |
| 6,803,113 B2 | | 10/2004 | Porter et al. |
| 7,115,320 B2 | | 10/2006 | Tanaka et al. |
| 7,799,399 B2 | | 9/2010 | Sargeant et al. |
| 2002/0094396 A1 | | 7/2002 | Ward et al. |
| 2004/0076821 A1 | | 4/2004 | Janssens et al. |
| 2004/0166337 A1 | | 8/2004 | Chang et al. |
| 2005/0208282 A1 | | 9/2005 | Wood, Jr. et al. |
| 2009/0022919 A1 | | 1/2009 | Chicarella et al. |
| 2009/0226991 A1 | | 9/2009 | Feldmen et al. |
| 2009/0246430 A1 | | 10/2009 | Kriegel et al. |
| 2010/0028512 A1 | | 2/2010 | Kriegel et al. |
| 2010/0314243 A1 | | 12/2010 | Frost et al. |
| 2011/0076733 A1 | | 3/2011 | Urano et al. |
| 2011/0087000 A1 | | 4/2011 | Peters et al. |
| 2011/0287199 A1 | | 11/2011 | Chicarella et al. |

FOREIGN PATENT DOCUMENTS

| | | |
|---|---|---|
| WO | WO-89/08558 | 9/1989 |
| WO | WO 2004/016417 | 2/2004 |

OTHER PUBLICATIONS

International Search Report and Written Opinion, dated Oct. 26, 2007, directed to corresponding International Application No. PCT/US07/13164.

Sargeant et al., U.S. Office Action mailed Dec. 21, 2007, directed to U.S. Appl. No. 11/651,103; 9 pages.

Sargeant et al., U.S. Office Action mailed Jul. 10, 2008, directed to U.S. Appl. No. 11/651,103; 11 pages.

Sargeant et al., U.S. Office Action mailed Jun. 1, 2009, directed to U.S. Appl. No. 11/651,103; 15 pages.

Sargeant et al., U.S. Office Action mailed Feb. 22, 2010, directed to related U.S. Appl. No. 11/651,103; 8 pages.

Mexican Office Action mailed Feb. 23, 2011, directed to Mexican Application No. MX/a/2008/015570; 2 pages.

Chicarella, G. et al., U.S. Office Action mailed Aug. 19, 2011, directed to U.S. Appl. No. 12/202,655; 6 pages.

Chicarella et al., U.S. Final Office Action mailed Mar. 5, 2012, directed to U.S. Appl. No. 12/202,655; 5 pages.

EP Extended Search Report mailed Nov. 17, 2011, directed to EP Patent Application No. 07777400.8; 8 pages.

Chicarella, G. et al., U.S. Office Action mailed Jan. 23, 2012, directed to U.S. Appl. No. 13/196,495; 6 pages.

"Explanation of Results—Biobased Analysis using ASTM D6866," located at <http://www.betalabservices.com/PDF/ASTM-D6866-Example-Report-JP.pdf> (6 pages).

Roerink, F. (Feb. 15, 2011). "Avantium's YXY: Green Materials and Fuels," *Avantium Presentation at 2nd Annual Bio-Based Chemicals Summiit*: 24 pages.

Furlong, K. (Mar. 28, 2012). "Commercializing BioFormPX(tm)," *Virent Presentation at BioPlastek 2012*: 30 pages.

Huang, S. (Mar. 28, 2012). "Coca-Cola's Roadmap Towards 100% Renewable Packaging," *Coca-Cola Presentation at BioPlastek 2012*: 30 pages.

Julian, A. (Jun. 2011). "Transforming an Industry—Capturing the Promise of 100% Bio-based Polymers," *Draths Corporation Presentation at BioPlastek 2011*: 27 pages.

Sakellarides et al., U.S. Office Action mailed Sep. 17, 2012, directed to U.S. Appl. No. 13/179,007; 10 pages.

Chicarella et al., U.S. Office Action mailed Oct. 4, 2012, directed to U.S. Appl. No. 12/202,655; 6 pages.

Bozell et al. (Mar. 2010). "Technology Development for the Production of Biobased Products from Biorefinery Carbohydrates—the US Department of Energy's 'Top 10' Revisited," Green Chemistry 14(4). 539-554.

* cited by examiner

ID_THAN AIR BALLOON MADE
LIGHTER THAN AIR BALLOON MADE FROM A BIAXIALLY ORIENTED POLYESTER FILM

CROSS REFERENCE TO RELATED APPLICATIONS

This application is a divisional application of U.S. Ser. No. 12/202,655, filed Sep. 2, 2008, which is a continuation-in-part application of U.S. Ser. No. 11/651,103, filed Jan. 9, 2007, now U.S. Pat. No. 7,799,399, issued Sep. 21, 2010, which claims the benefit of U.S. Provisional Application Ser. No. 60/811,410 filed Jun. 7, 2006, the contents of which are incorporated herein by reference.

FIELD OF INVENTION

This invention relates to lighter than air balloons including a high barrier lamination. The lamination may include a co-extruded and biaxially oriented polyester film.

BACKGROUND OF INVENTION

Lighter than air balloons may be formed from thin plastic films that include a gas barrier layer. Compared with conventional latex balloons, such films may reduce diffusion of lighter than air gases like helium, the gas typically used for inflating balloons, and give the balloons more attractive appearance like a Valentine's Day heart shape, flower shapes, animal shape, any famous character printing thereon and so on.

U.S. Pat. No. 4,077,588, the disclosure of which is totally incorporated by reference herein, describes in the Abstract thereof a substantially permanently buoyant balloon suitable for use as a toy or in advertising. For example, a balloon is provided which includes an envelope containing a lighter than air gas such as helium. The envelope is made from attached panels of a non-elastomeric polymer sheet material carrying a continuous metal layer on at least one side thereof. The metal layer can either be a thin metal film contiguously bonded to the polymer, or can be metal which is vapor deposited over the surface of the polymer. The balloon itself is constructed so that the ratio of its volume taken to the two-thirds power divided by its surface area is in the range of form about 0.21 to about 0.01, and the weight of the envelope can range from about $2.6 \times 10^{-4}$ gm/cm$^2$ to about $1.7 \times 10^{-2}$ gm/cm$^2$. The envelope is preferably manufactured in a two dimensional "lay-flat" form in any desired two dimensional shape, unlike conventional balloon envelopes which are inherently three dimensional surfaces. Balloon envelopes having the above described volume to surface area ratio and made with the above described composite panel material will be maintained buoyant for an indefinite period of time when filled with the lighter than air gas.

U.S. Pat. No. 5,338,243, the disclosure of which is totally incorporated by reference herein, describes in the Abstract thereof a balloon product, including at least two sheets, having a background depiction on one sheet and a foreground depiction on the other. The foreground depiction has a complementary relationship to the background depiction so as to provide a three-dimensional animated image.

U.S. Pat. No. 5,713,777, the disclosure of which is totally incorporated by reference herein, describes in the Abstract thereof a non-latex inflatable toy in the form of a hand puppet. The puppet includes three sheets defining an inflatable chamber and a pocket for the hand of the user.

The appropriate components and process aspects of each of the foregoing U.S. Patents may be selected for the present disclosure in embodiments thereof.

Although there have been attempts to improve the barrier properties of oriented polyester films in order to improve the lifetime of the balloons, there are other factors that also contribute to the lifetime of the balloons. More specifically, the leakage of helium gas occurs not only through the gas barrier film surface, but also through the sealing area where the two sheets are enveloped, especially when the balloon is fully inflated. The reason for this weak sealing of the oriented polyester film is that the surface of the oriented film is highly crystallized and shows poor sealing strength with the sealing layer. Another disadvantage of the oriented polyester film is that poor adhesion with the gas barrier layer occurs due to the same reason.

Further, the processes of the balloon fabrication are severe, involving abrasion/wet coating, and reduce the effectiveness of the gas barrier layer by damage and removal. The gas barrier of the processed balloon should not be significantly degraded compared to the unprocessed substrate used. Furthermore, the balloon will be exposed to unexpected handling during the market use, folded, smashed etc under various climate conditions.

SUMMARY OF THE INVENTION

Describe are lighter than air balloons including a high barrier lamination. The lamination may include a co-extruded and biaxially oriented polyester film.

One embodiment is a long life balloon formed from a lamination. The lamination includes a polyester film with a total thickness of 4 µm to 12 µm. The polyester film includes a biaxially oriented polyester core layer and at least one amorphous copolyester skin layer. The lamination also includes a sealant layer and a gas barrier layer on an opposite side of the polyester film from the sealant layer. The oxygen transmission rate of the balloon is less than 0.1 cc/100 sqin/day, a bonding strength of the gas barrier layer to the surface of the polyester film is more than 300 g/in at dry conditions, a sealing strength of the balloon is more than 3.5 kg/in, and a floating time of the balloon is more than 20 days.

The sealant layer may include a low density polyethylene. The lamination may include an anchor layer between the sealant layer and the amorphous copolyester skin layer. The lamination may include a primer layer between the biaxially oriented core layer and the gas barrier layer. The biaxially oriented core layer may be co-extruded with the amorphous copolyester skin layer.

The amorphous copolyester skin layer may have a melting point of less than 210° C. and the amorphous copolyester skin layer may contain no added particles. The dry bonding strength of the gas barrier layer may be more than 600 g/in. The floating time of the balloon may be more than about 30 days.

Another embodiment of a balloon formed from a lamination includes a lamination including a polyester film with a total thickness of 4 µm to 12 µm and including a biaxially oriented polyester core layer and at least one amorphous copolyester skin layer. The lamination may also include a sealant layer adjacent to the amorphous copolyester skin layer, a first gas barrier layer on an opposite side of the polyester film from the sealant layer, and a second gas barrier layer on the first gas barrier layer. An oxygen transmission rate of the balloon may be less than 0.02 cc/100 sqin/day, a sealing strength of the balloon may be more than 3.5 kg/in, and a floating time of the balloon may be more than 40 days.

The first or second gas barrier layer may be a metal or ceramic layer. The first or second gas barrier layer may include a polymer, such as for example ethylene-vinyl alcohol polymer, a poly vinyl alcohol polymer, or a poly vinyl amine copolymer. The gas barrier including the polymer may further include at least one cross-linker. The sealant layer may include a low density polyethylene.

The balloon may further include an anchor layer between the sealant layer and the amorphous copolyester skin layer. The first gas barrier layer may be on a surface of the biaxially oriented core layer. The balloon may include a primer layer between the biaxially oriented core layer and the first gas barrier layer. The biaxially oriented core layer may be co-extruded with the amorphous copolyester skin layer. The floating time of the balloon may be more than about 50 days.

Yet another embodiment of a balloon formed from a lamination includes a lamination including a polyester film with a total thickness of 4 µm to 12 µm including a biaxially oriented polyester core layer and at least one amorphous copolyester skin layer, a sealant layer adjacent to the amorphous copolyester skin layer, and a ceramic gas barrier layer on an opposite side of the polyester film from the sealant layer. The oxygen transmission rate of the balloon may be less than 0.1 cc/100 sqin/day, a sealing strength of the balloon may be more than 3.5 kg/in, a total light transmittance of the lamination may be more than 30% and a floating time of the balloon may be more than 20 days.

The sealant layer may include a low density polyethylene. The ceramic gas barrier layer may include AlOx or SiOx. The balloon may include an anchor layer between the sealant layer and the amorphous copolyester skin layer, and a primer layer between the biaxially oriented core layer and the ceramic gas barrier layer. The biaxially oriented core layer may be co-extruded with the amorphous copolyester skin layer.

The haze of the lamination may be less than 90%. The balloon may further include a second gas barrier layer on a ceramic gas barrier layer. The second gas barrier layer may include a polymer, such as ethylene-vinyl alcohol polymer, a poly vinyl alcohol polymer, or a poly vinyl amine copolymer. The second gas barrier layer may further include at least one cross-linker. The floating time of the balloon may be more than 30 days.

DETAILED DESCRIPTION OF THE INVENTION

Described are long life balloons formed from a lamination. The lamination may include a polyester film that includes a biaxially oriented polyester core layer and an amorphous copolyester skin layer. The lamination may also include a sealant layer and a gas barrier layer on an opposite side of the polyester film from the sealant layer.

The balloons may have an oxygen transmission rate of less than 0.1 cc/100 sqin/day, a bonding strength of the gas barrier layer to the surface of the polyester film of more than 300 g/in at dry conditions, a sealing strength of the balloon of more than 3.5 kg/in, and a floating time of the balloon is more than 20 days.

In embodiments, a film material for the balloon may include a thin, extensible, yet stress crack resistant film material including two or more layers. The film may be prepared on, for example, a commercial biaxially orientation tentering film line.

Figure 1:
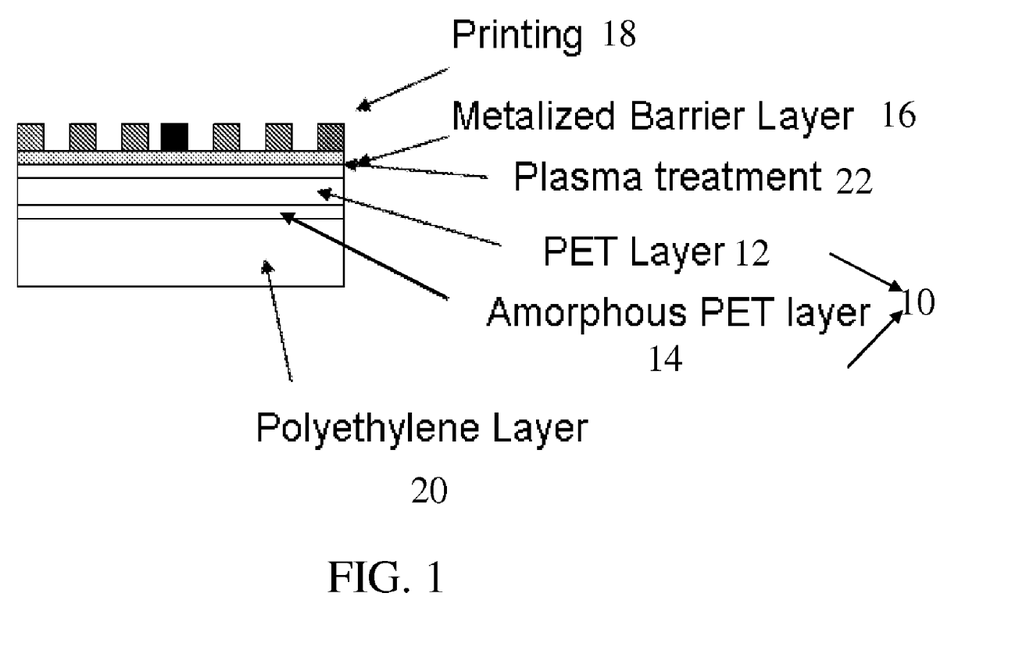
FIG. 1 is a cross-sectional view of a film in accordance with one possible embodiment of the present disclosure.

An embodiment shown in FIG. 1 includes a film 10 including a first high crystalline polyester layer 12 and a second amorphous copolyester layer 14. Preferably, the thickness of film 10 including layers 12 and 14 is 4-12 µm, or 6-9 µm. The structure in FIG. 1 also includes a linear low density polyethylene (LLDPE) layer 20.

The high crystalline polyester layer 12 can include any suitable material. For example, in embodiments, high crystalline polyester layer 12 includes high intrinsic viscosity (IV) homopolyesters or copolyester of PET/PBT, for example, in embodiments, an intrinsic viscosity (IV)>0.50 or an IV of >0.60.

Crystallinity is defined as the weight fraction of material producing a crystalline exotherm when measured using a differential scanning calorimeter. For high crystalline polyester, an exothermic peak in the melt range of 220° C. to 290° C. is most often observed. High crystallinity is therefore defined as the ratio of the heat capacity of material melting in the range of 220° C. to 290° C. versus the total potential heat capacity for the entire material present if it were all to melt. A crystallinity value of >35% weight fraction is considered high crystallinity. The amorphous copolyester layer 14 can include any suitable material. For example, in embodiments, amorphous copolyester layer 14 includes isophthalate modified copolyesters, sebacic acid modified copolyesters, diethyleneglycol modified copolyesters, triethyleneglycolmodified copolyesters, cyclohexanedimethanol modified copolyesters. A metallized barrier layer 16 may be disposed over all or a part of the high crystalline layer 12. Deposition of the barrier layer may be done via a low pressure vacuum metalizing process of metal such as aluminum, or ceramic such as AlOx, SiOx. In embodiments, the film may be processed into any desired configuration. For example, printing 18 may be disposed upon metallized layer 16.

The following Examples are being submitted to further define various species of the present disclosure. These Examples are intended to be illustrative only and are not intended to limit the scope of the present disclosure. Also, parts and percentages are by weight unless otherwise indicated.

Figure 2:
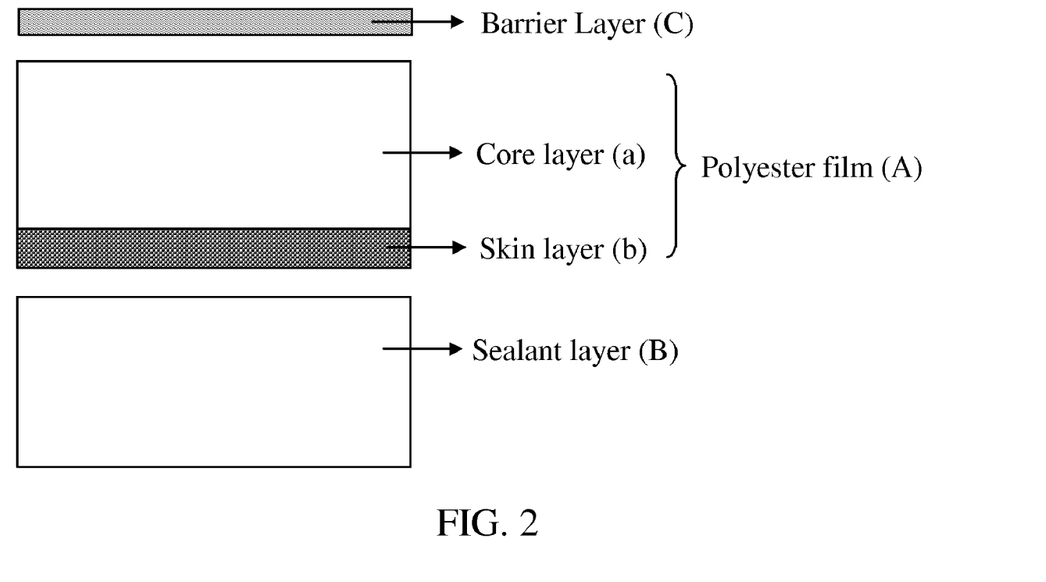
FIG. 2 illustrates an example of a multi-layer oriented polyester film (A) used as part of a lamination in accordance with an embodiment of the present disclosure.

FIG. 2 shows an example of a multi-layer oriented polyester film (A) used as part of a lamination. The oriented polyester film (A) may include at least two layers, a core layer (a) and at least one skin layer (b).

The core layer (a) may be a high crystalline polyester film achieved by bi-axial orientation. This crystallized portion of the film may contribute to making the film stiff and tear resistant during the balloon fabrication process, while remaining thin enough to make the balloon light.

The polyester of the core layer (a) may be a polymer obtained by polycondensation of a diol and a dicarboxylic acid. The dicarboxylic acids may include, for example, terephthalic acid, isophthalic acid, phthalic acid, naphthalenedicarboxylic acid, adipic acid and sebacic acid, and the diols may include, for example, ethylene glycol, trimethylene glycol, tetramethylene glycol and cyclohexane dimethanol.

The polyesters may include, for example, polymethylene terephthalate, polyethylene terephthalate, polypropylene terephthalate, polyethylene isophthalate, polytetramethylene terephthalate, polyethylene-p-oxybenzoate, poly-1,4-cyclohexylenedimethylene terephthalate and polyethylene-2,6-naphthalate.

These polyesters may be homopolymers and copolymers, and the co-monomers may include, for example, diols such as diethylene glycol, neopentyl glycol and polyalkylene glycols, dicarboxylic acids such as adipic acid, sebacic acid, phthalic acid, isophthalic acid and 2,6-naphthalenedicarboxylic acid, and hydroxycarboxylic acids such as hydroxybenzoic acid and 6-hydroxy-2-naphthoic acid.

Polyethylene terephthalate, and polyethylene naphthalate (polyethylene-2,6-naphthalate) may be used to achieve higher crystallinity. Further, the polyester may include various types of additives, for example, an antioxidant, a heat-resistant stabilizer, a weather-resistant stabilizer, an ultraviolet ray absorber, an organic slipperiness imparting agent, a pigment, a dye, organic or inorganic fine particles, a filler, an antistatic agent, a nucleating agent and the like.

One or more skin layer(s) may be co-extruded with the core layer (a) to increase the bonding between the core layer and the skin layer(s). FIG. 2, shows a skin layer (b) adjacent to heat sealant layer (B). The skin layer (b) adjacent to the heat sealant layer (B) may include an amorphous polyester to increase the bonding between the skin layer (b) and the heat sealant layer (B).

The melting point of the skin layer (b) adjacent to the heat sealant layer (B) may be 210° C. or less. If the melting point of the skin layer (b) is much higher than 210° C., the amorphous layer may not melt well during a heat set process of the biaxially oriented film. This could cause low sealing strength during the heat sealing process used to fabricate the film into a balloon.

The copolyester for this skin layer (b) may be a copolyester made from polycondensation of diols and dicarboxylic acids described above. The skin layer (b) is kept amorphous during and after the film making process. A preferred polyester for the amorphous layer is a copolyester of isophtalate. The mol % of the isophtalate may be higher than 10 mol %, or more than 15 mol %.

The thickness of skin layer (b) may be 0.2 µm to 1.5 µm, more preferably. 0.3 µm to 0.7 µm. If the skin layer (b) is thinner than 0.2 µm, sufficient sealing strength may not been obtained. If skin layer (b) is thicker than 1.5 µm, the polyester film (A) may not be stiff enough to support the balloon structure and the film may be difficult to handle.

The leakage of the helium gas occurs not only through the gas barrier film surface, but also though the sealing area where the two sheets are enveloped, especially when the balloon is fully inflated. Accordingly, the sealing strength of the sealant layer after balloon fabrication may be more than about 3.5 kgf/in, or more than about 4 kgf/in, to prevent leakage of helium gas through the heat sealed portion.

The skin layer (b) adjacent to the heat sealant layer (B) may not include any added particles. Such particles may be used to make the film slippery and improve handling. However, such particles would enhance the crystallinity of the amorphous layer, which could decrease the sealing strength between the heat sealant layer (B). These particles may also create bumps on the surface of the gas barrier layer when the film is wound on a roll.

In the method of producing the polyester film (A) of the present invention, melted polymers for the core layer (a) and the skin layer (b) may be co-extruded and laminated on a cooling drum and solidified to form a sheet. The sheet-shaped molding is preferably stretched 2 to 5 times in the longitudinal direction and 2 to 5 times in the transverse direction, and then heat-set at a temperature of 220 to 250° C.

In embodiments, the total thickness of the polyester film (A) may be 4 µm to 12 µm, preferably, 6 to 9 µm. If the film is thicker than 12 µm, the unit weight of the balloon may become too great to achieve the targeted floatation time at higher elevations where air density is lower. If the film is thinner than 4 µm, the film may not be robust enough to survive the severe processes of balloon fabrication, causing wrinkles, folding and web breaks.

Recycled pellets made from the polyester film (A) may also usable.

Figure 3:
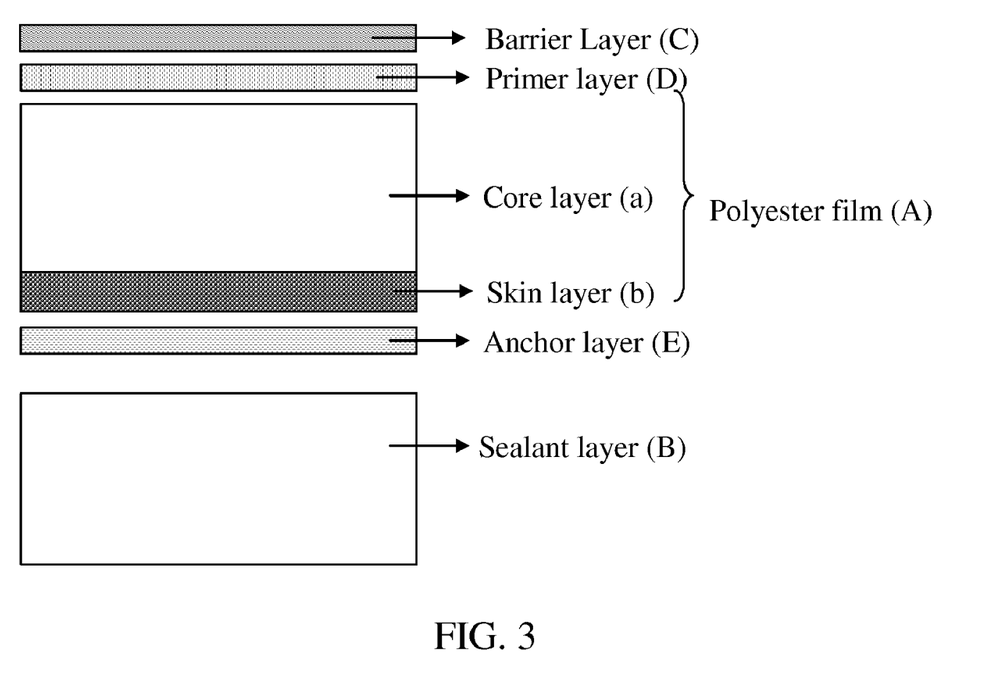
FIG. 3 illustrates an example of a lamination that includes a primer layer (D) and an anchor layer (E) in accordance with an embodiment of the present disclosure.

FIG. 3 shows an embodiment of a lamination that includes a primer layer (D) and an anchor layer (E). Primer layer (D) may be applied between the polyester film (A) and the gas barrier layer (C), to increase the bonding between them and to prevent damage or removal. Similarly, the anchor layer (E) may be used to increase bonding between the polyester film (a) and sealant layer (B).

At least one anchor layer (E) may be applied before the sealant layer (B) is laminated on the polyester film (A). The anchor layer (E) may be selected from, but not limited to, a polyethylene dispersion, particularly polyethylenimine.

Anchor layer (E) may be applied in a dispersion in water or another solvent, using an application method such as gravure coating, meyer rod coating, slot die, knife over roll, or any variation of roll coating. The applied dispersion may then be dried with hot air, leaving a layer approximately 0.01 to 0.1 µm thick. The skin layer (b) may be treated prior to application of the anchor layer (E). The treatment is used to increase the surface energy of the skin layer (b) to increase wetting of the dispersion and bond strength of the dried anchor layer (E). Treatment methods include corona, gas modified corona, atmospheric plasma, and flame treatment.

Sealant layer (B) may be hot melt extruded as a coating onto the anchor layer (E). The sealant layer (B) may be a grade of Low Density Polyetheylene, or a blend of Low Density Polyethylene and Linear Low Density Polyethylene. The temperature of the melt may be from 305 to 325° C., with a higher temperature being preferable for melting of the skin layer (b). The melt layer may then be chilled to form sealant layer (B) with a thickness of from 10 to 20 µm.

Another method for applying the sealant layer (B) is to use an adhesive to laminate a pre-formed Low Density Polyethylene sheet to the skin layer (b). Suitable adhesives include, but are not limited to, polyester, polyester urethane, polyether urethane, and acrylic chemistries. Adhesive thickness may be from 1 to 6 µm thick. The thickness of pre-formed low density polyethylene sealant sheet may range from 10 to 100 µm, preferably using thinner sealant sheet from 10-30 µm for smaller volume balloons, less than 11 ft$^3$, to maintain buoyancy in air.

The gas barrier of the film is one of the factors in maintaining the long life of a balloon. At least one gas barrier layer (C) may be applied on the surface of the polyester film (A) to make the oxygen transmission rate of the balloon less than 0.1 cc/100 sqin/day. The gas barrier layers may be a metallized layer such as Al, or a ceramic deposition layer such as SiOx and AlOx.

The metallizing gas barrier layer/ceramic deposition layer may be applied using any available deposition method such as physical vapor deposition, or chemical vapor deposition. The most common method is physical vapor deposition of an Al layer in a vacuum, in which aluminum is heated in absolute pressure preferably less than $1.0 \times 10^{-3}$ mbar. The low pressure allows aluminum to form a vapor at a considerably lower temperature so that it can be applied without thermal damage to the film. The aluminum can be in the form of a wire that is fed to the surface of an electrically heated plate known as a boat. Or the aluminum can be in the form of an ingot that is heated within a crucible. The aluminum vapor is condensed on the film surface in an open span or with the film against a chill roll to dissipate the heat of the vapor. The condensed aluminum vapor forms grains of solid aluminum with a total thickness of 50 to 1000 angstroms. Preferably, the thickness of the aluminum layer is between 300 to 500 angstroms. A thin aluminum layer may not provide a very high gas barrier, and thick layers are difficult and inefficient to apply, and in practice provide diminishing performance vs. additional thickness.

Adhesion between the gas barrier layer (C) and the polyester layer (A) may be also a factor in increasing the lifetime of a balloon formed from a lamination because damage or removal of the gas barrier layer during the severe processes of balloon fabrication and un-expected handling at the end consumers degrades the barrier property of the film.

The bonding strength between the polyester film (A) and the gas barrier layer (C) may be more than 300 g/in, preferably more than 600 g/in. To achieve such bond strength values, an electrical treatment such as plasma/corona treatment on the polyester film (A) may be used before the gas barrier layer is applied on the polyester film (A). Since the film may be exposed to wet processes during the balloon fabrication and wet climates during the consumer's usage, the bonding strength between the polyester film (A) and the gas barrier layer (C) in wet conditions is preferably more than 30 g/in, more preferably more than 50 g/in. To achieve such high dry and wet bond strength values, an additional deposition anchorage layer, such as Cu seeding, Ni seeding may be applied before the main metal/ceramic barrier layer is deposited. In addition, the additional primer layer (D) may be applied between the polyester film (A) and the gas barrier layer (C), increasing the bonding between them and preventing the damage or removal of the barrier layer (C).

The primer layer (D) may be a polymeric binder that adheres well with both the polyester film (A) and the gas barrier layer. Examples of such polymers may include, but are not limited to, polyester, acrylic, polyurethane and their mixture or co-polymer.

The polyester for the additional primer layer (D) may be selected from polyester resin copolymerized with a compound having a carboxylic acid base. Examples of compounds having a carboxylic acid base include, for example, trimellitic acid, trimelliticanhydride, pyromellitic acid, pyromellitic anhydride, 4-methylcyclohexene-1,2,3-tricarboxylic acid, trimesic acid, 1,2,3,4-butane tetracarboxylic acid, 1,2,3,4-pentane tetracarboxylic acid, 3,3',4,4'-benzophenone tetracarbxylic acid, 5-(2,5-dioxotetrahydrofurfuryl)-3-methyl-3-cyclohexene-1,2-dicarboxylic acid, 5-(2,5-dioxotetrahydrofurfuryl)-3-cyclohexene-1,2-dicarboxylic acid, cyclopentane tetracarboxylic acid, 2,3,6,7-naphthalene tetracarboxylic acid, 1,2,5,6-naphthalene tetracarboxylic acid, ethylene glycol bistrimellitate, 2,2',3,3'-diphenyl tetracarboxylic acid, thiophene-2,3,4,5-tetracarboxylic acid, ethylene tetracarboxylic acid and the like, or alkali metal salts, alkali earth metal salts and ammonium salts thereof can be used; however, the present invention is not limited to these compounds.

As diol components of the polyester resins (A) and (B) ethylene glycol, diethylene glycol, polyethylene glycol, propylene glycol, polypropylene glycol, 1,3-propane diol, 1,3-butanediol, 1,4-butanediol, 1,5-pentanediol, 1,6-hexane diol, 1,7-heptane diol, 1,8-octane diol, 1,9-nonane diol, 1,10-decane diol, 2,4-dimethyl-2-ethylhexane-1,3-diol, neopentylglycol, 2-ethyl-2-butyl-1,3-propane diol, 2-ethyl-2-isobutyl-1,3-propane diol, 3-methyl-1,5-pentane diol, 2,2,4-trimethyl-1,6-hexane diol, 1,2-cyclohexane dimethanol, 1,3-cyclohexane dimethanol, 1,4-cyclohexane dimethanol, 2,2,4,4-tetramethyl-1,3-cyclobutane diol, 4,4'-thiodiphenol, bisphenol A, 4,4'-methylene diphenol, 4,4'-(2-norbornylidene)diphenol, 4,4'-dihydroxybiphenol, o-, m- and p-dihydroxybenzene, 4,4'-isopropylidene phenol, 4,4'-isopropylidene bindiol, cyclopentane-1,2-diol, cyclohexane-1,2-diol, cyclohexane-1,4-diol, bisphenol A and the like can be used.

The acrylic resin for the additional primer layer (D) may be selected from resins such as a monomer component which constitutes the acrylic resin, for example, an alkyl acrylate, an alkyl methacrylate, (examples of such alkyl groups include a methyl group, an ethyl group, an n-propyl group, an isopropyl group, an n-butyl group, an isobutyl group, a t-butyl group, a 2-ethylhexyl group, a lauryl group, a stearyl group, a cyclohexyl group, a phenyl group, a benzyl group, a phenylethyl group and the like), a monomer having a hydroxyl group such as 2-hydroxyethyl acrylate, 2-hydroxyethyl methacrylate, 2-hydroxypropyl acrylate, 2-hydroxypropyl methacrylate or the like, a monomer having an amide group such as acrylamide, methacrylamide, N-methyl acrylamide, N-methyl methacrylamide, N-methylol acrylamide, N-methylol methacrylamide, N,N-dimethylol acrylamide, N-methoxymethyl acrylamide, N-methoxymethylmethacrylamide, N-phenyl acrylamide or the like, a monomer having an amino group such as N,N-diethylamino ethyl acrylate, N,N-diethylamino ethyl methacrylate or the like, a monomer having an epoxy group such as glycidyl acrylate, glycidyl methacrylate or the like, a monomer having a carboxylic acid or a salt thereof such as acrylic acid, methacrylic acid or a salt thereof (an alkali metal salt, an alkali earth metal salt, an ammonium salt or the like) and the like whereupon one or more types of these monomer components are copolymerized.

In addition to the binder, a proper cross-linker may reinforce the bonding. Examples of the cross-linker include a melamine-based cross-linker, epoxy-based cross-linker, aziridine-based cross-linker, epoxyamide compounds, titanate-based coupling agents, e.g., titanium chelate, oxazoline-based cross-linker, isocyanate-based cross-linker, methylolurea or alkylolurea-based cross-linkers, and acrylamide-based cross-linkers.

The primer layer (D) may be applied in a dispersion or solution of water or another solvent, using an application method such as gravure coating, meyer rod coating, slot die, knife over roll, or any variation of roll coating. The in-line coating method, applying the primer layer in the process of polyester film (A), is preferred. The primer dispersion or solution may be applied right after the elongation step in the longitudinal direction, then dried in an oven following elongation step in the transverse direction. The thickness of the primer layer (B) may be between 10 nm to 200 nm, more preferably, 20 nm to 100 nm to obtain preferable adhesiveness and gas barrier properties.

These layers and processes can used to produce a balloon that shows extra long life, floating consistently, and maintains it shape for sale more than about 20 days, preferably more than about 30 days after being properly filled with helium gas.

In order to further improve the lifetime of a balloon a lamination that includes two or more gas barrier layers can be produced. For example, one of the gas barrier layers can be a metallized or ceramic layer and the other can be a polymer gas barrier layer.

Figure 4:
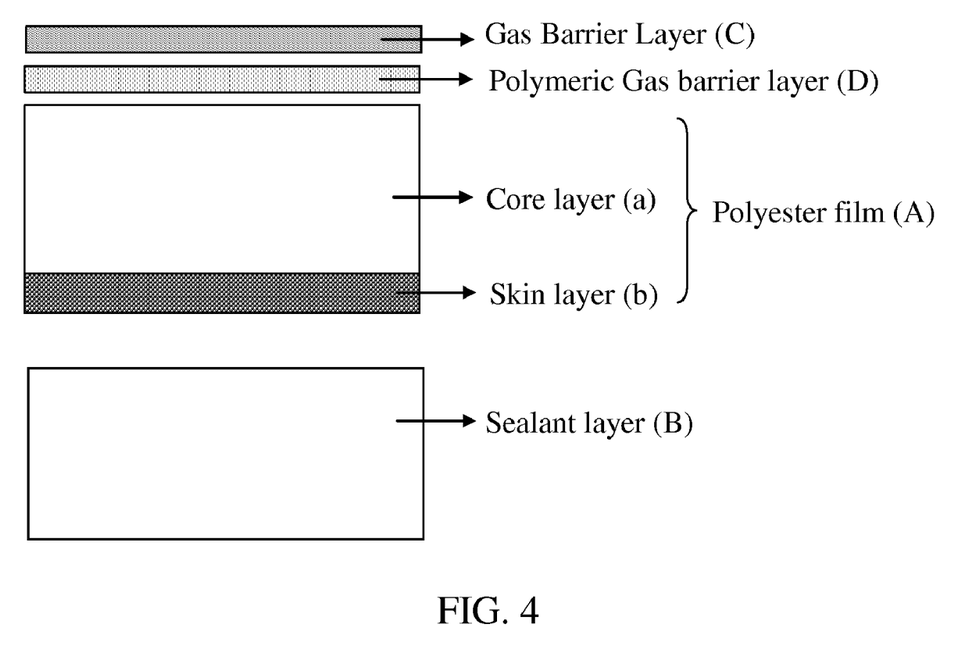
FIG. 4 illustrates an embodiment in which a polymeric gas barrier layer (D) is formed between a metallized or ceramic gas barrier layer (C) and the polyester film (A) in accordance with an embodiment of the present disclosure.
Figure 5:
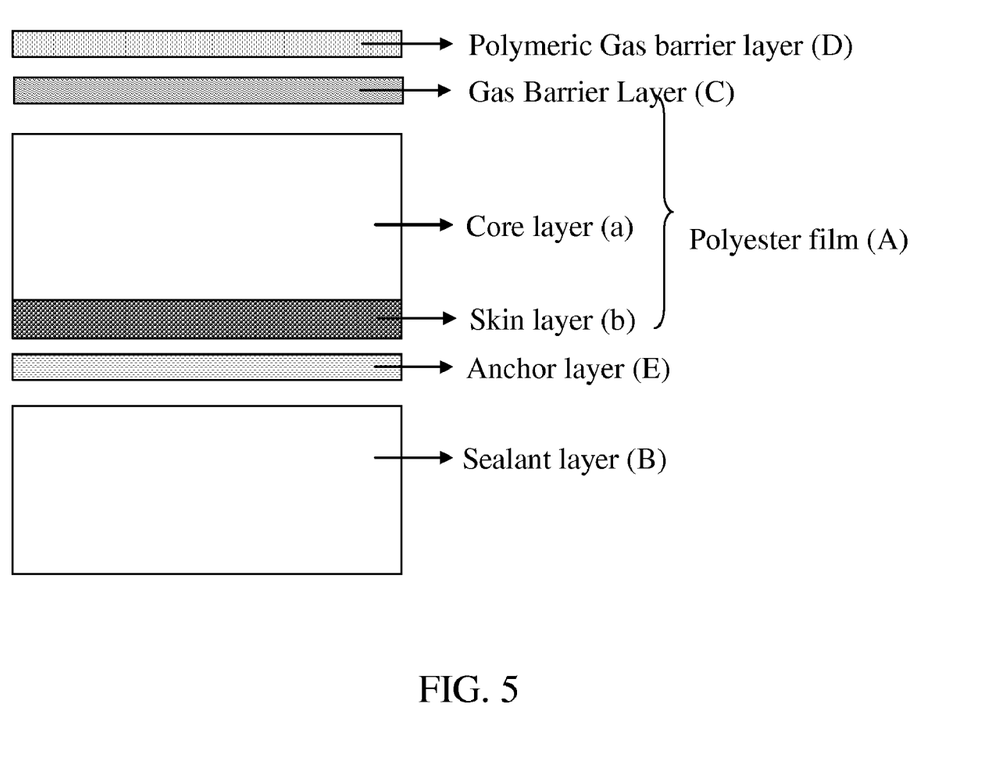
FIG. 5 illustrates an embodiment in which a polymeric gas barrier layer (D) is formed on top of a metallized or ceramic gas barrier layer (C) in accordance with an embodiment of the present disclosure.

FIGS. 4 and 5 illustrate embodiments that include two gas barrier layers. FIG. 4 illustrates an embodiment in which a polymeric gas barrier layer (D) is formed between a metallized or ceramic gas barrier layer (C) and the polyester film (A). FIG. 5 illustrates an embodiment in which a polymeric gas barrier layer (D) is formed on top of a metallized or ceramic gas barrier layer (C). The laminate in FIG. 5 also includes an anchor layer (E) between the skin layer (b) of polyester film (A) and sealant layer (B).

The combination of the metallized layer/ceramic deposition layer and the polymeric layer creates a very high gas barrier property that can further improve the life time of a balloon. In addition to improving the gas barrier characteristics of the laminate, a gas barrier layer (D) can also prevent damage or removal of the gas barrier layer (C) during the severe processes of balloon fabrication and during handling by the end consumer. The polymeric barrier layer (D) may be softer than the metal/ceramic barrier layer (C) and is able to maintain a good barrier as the secondary barrier layer after possessing and handling.

The gas barrier layer (D) can exist anywhere in the laminate, preferably, between the gas barrier layer (C) and the surface of the polyester film (A) or on the top of the gas barrier layer (C). The polymeric gas barrier layer can include ethylene-vinyl alcohol (EVOH), poly vinyl alcohol (PVOH), poly vinyl amine, and their mixture or co-polymer.

In addition, a proper cross-linker can be added to reinforce the layer. Examples of cross-linkers include melamine-based cross-linkers, epoxy-based cross-linkers, aziridine-based cross-linkers, epoxyamide compounds, titanate-based coupling agents, e.g., titanium chelate, oxazoline-based cross-linkers, isocyanate-based cross-linkers, methylolurea or alkylolurea-based cross-linkers, aldehyde-based cross-linkers and acrylamide-based.

The polymeric gas barrier layer (D) may be applied in a dispersion or solution in water or another solvent, using an application method such as gravure coating, meyer rod coating, slot die, knife over roll, or any variation of roll coating. The applied dispersion or solution may then be dried with hot air. The surface may be treated prior to application of the polymeric gas barrier layer.

The polymeric coating formulation may be selected to enable solutions to be in-line coated, stretched in the transverse orientation process without attendant and cracking problems, and to provide excellent gas barrier properties. For example, a higher content of hydroxyl groups in the polymers may provide increased water solubility and better barrier properties. Such polymers, however, may cause cracking in the layer upon transverse direction orientation, which may ultimately degrade the barrier property.

A lamination including the polymeric gas barrier layer may have an O2TR of less than 0.02 cc/100 sqin/day, preferably less than 0.01 cc/100 sqin/day. Accordingly, a balloon including such a lamination can possess extra long life, floating consistently more than about 40 days, and maintain its shape for sale, preferably more than about 50 days after proper filling with helium gas.

Once the laminations are prepared, the following process may be used to fabricate the balloons: 1) flexographic printing of graphic designs on the opposite surface of the sealant, 2) slitting of the subsequent printed web, 3) fabrication of balloons by die-cutting and heat sealing process, and 4) folding and packaging of the finished balloons.

Flexographic printing may be used to print graphic designs on the balloons. The printing equipment used in this process may be set up in a manner that will prevent scratching; scuffing or abrading the gas barrier surface. The opposite side of the sealant layer of the laminate may be printed on the metal surface with up to 10 colors of ink, using a flexographic printing press. Each color receives some drying prior to application of the subsequent color. After print application, the inks may be fully dried in a roller convective oven to remove all solvents from the ink.

Slitting may be accomplished in any suitable fashion. The slitting equipment used in this process is desirably set up in a manner that will prevent scratching; scuffing or abrading the gas barrier surface. In one embodiment, the printed web may be cut to lengths adequate for the balloon fabrication process by rewinding on a center driven rewinder/slitter using lay-on nip rolls to control air entrapment of the rewound roll.

Balloon fabrication may be accomplished in any suitable fashion. The fabrication equipment used in this process is desirably set up in a manner that will prevent scratching; scuffing or abrading the gas barrier surface. The slit webs may be fabricated into balloons by aligning two or more webs into position so that the printed graphics are properly registered to each other, then are adhered to each other and cut into shapes using known methods. A seam thickness of 1/64" to 1/2" may be used, as this seam thickness has been found to have greater resistance to defects with an optimal seam being 1/16" to 1/8". Optionally, a valve can be inserted into an opening and the layers abutting the valve adhered to form a complete structure.

Folding may be accomplished in any suitable fashion. The folding equipment used in this process is desirably set up in a manner that will prevent scratching; scuffing or abrading the gas barrier surface. The fabricated balloons may be mechanically folded along multiple axes using many different mechanical process or by hand. The balloon can be folded to the proper size mechanically and then mechanically or by hand loaded into a pouch. The balloon can also be hand folded along multiple axes with care taken not to scratch, scuff or abrade the metalized surface. The hand folded balloon can also be inserted into a pouch by hand or mechanically.

EXAMPLES

This invention will be better understood with reference to the following examples, which are intended to illustrate specific embodiments within the overall scope of the invention.

Testing Methods

Oxygen barrier was measured on a MOCON Ox-Tran L series device utilizing ASTM D3985. Testing conditions used were 73° F., 0% relative humidity, and 1 ATM. For this type of measurement, the gas barrier surface of the web is protected with a Stamark lamination. The lamination protects the gas barrier surface from handling damage, but makes no significant contribution to the oxygen barrier.

Dry bonding strength of the gas barrier layer (C) was measured by heat-sealing of a Dow PRIMACOR3300 film to the metal surface on a Sentinel heat sealer in a room which is air-conditioned as 73° F.+/−4° F. and 50%+/−5% RH. On the back side of the film, adhesive tape (3M 610) is applied to keep the film from breaking during the test. Heat seal conditions are 220° F. temperature, 20 seconds dwell time, and 40 psi jaw pressure, 1 heated jaw. Prior to peeling the sealed materials are cut so that each web can be gripped in a separate jaw of the tensile tester and 1"×1" section of sealed material can be peeled. The peel is initiated by hand and then the two webs are pealed apart on an Instron tensile tester in a 180.degree. configuration toward the PRIMACOR film If the metal is separated from the substrate and remains attached to the PRIMACOR film then the mean force of the peel is reported as the metal bond strength.

Wet bonding strength of the gas barrier layer (C) was measured by the same procedure as dry bonding strength, with the exception that a cotton swab soaked with water is used to apply water to the interface of the sealed area as it is being peeled.

Sealing strength of the balloon was measured as following. The seal layer is sealed to itself using a Pack Rite heat sealer with 15"×⅜" jaw. The heat seal conditions are 405° F. temperature, 2 seconds dwell time, and 90 psi jaw pressure, 1 heated jaw. Prior to peeling the sealed materials are cut so that each web can be gripped in a separate jaw of the tensile tester and 1'×⅜" section of sealed material can be peeled. The two webs are pealed apart on an Instron tensile tester in a 90° configuration known as a T-peel. The peel is initiated at a speed of 2"/minute until 0.5 lbs of resistance is measured to preload the sample. Then the peel is continued at a speed of 6"/minutes until the load drops by 20%, signaling failure. The maximum recorded load prior to failure is reported as the seal strength.

Metal Optical Density is measured using a Gretag D200-II measurement device. The device is zeroed by taking a measurement without a sample in place. Then the optical density of the polyester film layers and metallic gas barrier layer is measured every 3" across the web and the average is reported as the metal OD.

Melting point of polyester resin is measured using a TA Instruments Differential Scanning calorimeter 2920. A 0.007 g resin sample is tested, using ASTM D3418-03 The preliminary thermal cycle is not used, consistent with Note 6 of the ASTM Standard. The sample is then heated up to 280° C. temperature at a rate of 10° C. temperature/minute, the cooled back to room temperature while heat flow and temperature data is recorded. The melting point is reported as the temperature at the endothermic peak located between the range of 150 to 280° C. temperature.

Haze and total light transmittance were measured using a Byk Gardner Haze Gard Plus Hazemeter according to ASTM D1003.

60 degree gloss was measured using a Byk Gardner Tri-gloss meter according to ASTM D523.

Floating time of the balloon is determined by inflating it with helium gas and measuring the number of days that the balloon remains fully inflated. A balloon is filled from a helium source using a pressure regulated nozzle designed for "foil" balloons, such as the Corwin Precision Plus balloon inflation regulator and nozzle. The pressure should be regulated to 16 inches of water column. The balloon should be filled with helium in ambient conditions of about 20° C. temperature and 1 atmosphere barometric pressure. The balloon should be secured using adhesive tape on the outside of the balloon below the balloon's valve access hole to avoid creating any slow leaks of helium gas through the valve. During the testing the balloon should be kept in stable environment close the ambient conditions stated. Changes in temperature and barometric pressure should be recorded to interpret float time results, as any major fluctuations can invalidate the test. The balloon is judged to be no longer fully inflated when the appearance of the balloon changes so that the wrinkles running through the heat seal seam area become deeper and longer, extending into the front face of the balloon; and the cross-section of seam becomes a v-shape, as opposed to the rounded shape that characterizes a fully inflated balloon. At this time the balloon will still physically float, but will no longer have an aesthetically pleasing appearance. The number of days between initial inflation and the loss of aesthetic appearance described above is reported as the floating time of the balloon.

Example 1

An 36 Ga polyester laminated film was prepared from a blend of high crystalline polyester resin laminated to a layer of non-crystalline copolyester tentered to a final stretch ratio of about 3.8×3.8. The film was subsequently plasma treated and vacuum metallized with aluminum to an optical density of about 2.8. Oxygen barrier measurements were made on the top of the roll and at the bottom of the roll materials. Excellent barrier at the top and bottom of the roll was determined, showing good roll uniformity in the process. Furthermore, the film was processed into a final balloon form and the progress of the materials was recorded via a barrier measurement. As shown in Table 1, the balloon fabrication process did not change the barrier properties of the film significantly through the entire process showing excellent stress crack resistance of the materials.

Comparative Example 1

A 40 Ga metalized nylon sample was processed through the same balloon converting steps. Before the converting process, the barrier was measured of the thin gauge metalized nylon web. After final fabrication, the barrier of the structure was also measured as shown in Table 1. Also shown in Table 1 are the actual hang times that the balloon fabricated from the film retained its original shape, form and firmness.

Barrier results are shown in Table 1. The film described herein in embodiments maintains excellent barrier properties after processing into balloon shapes, etc. and inflated. Comparatively, materials prepared from Nylon film show a significant degradation of barrier after being processed and inflated.

TABLE 1

$O_2$ TR Barrier Testing (73° F., 0% RH)

| Sample Description | cc/100 sqin/day | Hang time in days |
| --- | --- | --- |
| Example #1-Roll surface | .02-.06 | |
| Example #1-Bottom of roll | .02-.06 | |
| Example #1-Extrusion Coated Roll#1 | .04-.09 | |
| Example #1-Printed Roll#1 (ink area) | .04-.09 | |
| Example #1-Printed Roll#1 (clear area) | .04-.09 | |
| Example #1-Slit and Printed process | .04-.09 | |
| Balloon Fabrication Roll#1 | .04-.09 | 21+ |
| Folded and Packaged Balloon Finished Roll#1 | .04-.09 | 21+ |
| Comparative Example 1-Metallized Nylon | .05-.09 | |
| Comparative Example 1 After Balloon Fabrication | .05-.09 | 4-7 |
| Comparative Example 1-after folding and insertion into package | .06-.22 | 2-7 |

Example 2

Polyester pellets as listed in Table 2 were mixed according to the blend ratios shown in Table 3 and extruded using a vent-type two-screw extruder and filtered for the skin layer (b). Polyester pellets listed in Table 2 were mixed according to the blend ratio shown in Table 3, dried and then extruded via extruder and filtered for the core layer (a). These melt streams were fed through a rectangular joining zone and laminated into a two layer co-extruded (a)/(b) structure. The resulting curtain was quenched on a casting drum, and oriented in the machine direction with a roller stretcher at the stretching ratio of 4.8 times at 250° F. Subsequently, using a chain driven stretcher, the film was oriented in the traverse direction at the stretching ratio of 4.2 times at 240° F. and heat-set at 460° F. The film was then wound up as a biaxially oriented polyester film (A) with the thickness listed in Table 3. The surface of the core layer (a) was metallized with Al to an optical density as listed in Table 4 and then wound up as a metallized film. In the metallizing chamber, a Cu seeding was performed before the Al metallization to enhance the metal bond. The contamination of the Cu was about 15 ng/cm$^2$ according to atomic absorption spectrometry.

The non-metallized surface of the metallized film was corona treated and was coated with anchor coating (E) solution (Mica A-131-X) using gravure coater. The anchor (E) was dried in a convective dryer. The dried anchor surface was then extrusion coated with LLDPE sealant (B) (Dowlex 3010, 13.6 µm thick).

The extrusion coated film was printed on the barrier surface with up to 10 colors of ink, using a flexographic printing press. After print application, the inks were fully dried in a roller convective oven to remove solvents from the ink. The printed web was cut to lengths adequate for the balloon fabrication process by rewinding on a centre driven rewinder/slitter using lay-on nip rolls to control air entrapment of the rewound roll.

The slit webs were fabricated into balloons by aligning 2 or more webs into position so that the printed graphics were properly registered to each other, then adhered to each other by heat sealing (about 400 F and 1 second) and cut into circle shape (17" diameter). The seam of the balloons was ⅛". A valve, as described in U.S. Pat. No. 4,917,646 was inserted into an opening and the layers abutting the valve adhered to form a complete structure. The fabricated balloons may be mechanically folded along multiple axes using mechanical processes or by hand for shipping. A certain number of balloons were taken for floating time tests as previously described. The properties of the films, webs and balloons are summarized in Table 4. The balloons of this Example 2 showed extra long life lasting 30-35 days.

Example 3

The same materials and processes as described in Example 2 were used, except a plasma treatment was performed before the Al metallization in stead of Cu seeding. The energy density of the treatment was approximately 1 KJ/M$^2$ and a nitrogen gas was used.

The properties of the films, webs and balloons are summarized in Table 4. The balloons of this Example 3 showed extra long life, lasting 20-30 days.

Example 4

The same materials and processes as described in Example 3 were used, except another Al metallizing was applied on the 1$^{st}$ Al metallizing layer using the same metallizing condition of the 1$^{st}$ Al metallizing.

The properties of the films, webs and balloons are summarized in Table 4 The metal bond strength test was done twice because the 2$^{nd}$ Al layer had very poor bonding strength compared with the 1$^{st}$ Al layer. The balloons of this Example 4 showed extra long life like about 30 to 35 days.

Example 5

The same materials and processes as described in Example 3 were used, except a different optical density for the Al coating was used. The properties of the films, webs and balloons are summarized in Table 4. The balloons of this Example 5 showed marginal long life, of about 20 days.

Example 6

The same materials and processes as described in Example 3 were used, except a different blend of the skin layer (b) was used.

The properties of the films, webs and balloons are summarized in Table 4. The balloons of this Example 6 showed marginal long life, of about 20 days.

Example 7

The same materials and processes as described in Example 3 were used, except the thickness of the Polyester film (A) was 12 µm.

The properties of the films, webs and balloons are summarized in Table 4. The balloons of this Example 6 did show extra long life, lasting about 20 days at low elevations such as sea level, where air density is high. However, typically sized balloons, such as those made from two 18 inch panels, did not display a strong buoyant force at high elevations due to the low density of air and increased weight of the balloon.

Comparative Example 2

Polyester pellets listed in Table 2 were mixed according to the blend ratio shown in Table 3, dried, extruded via extruder, and filtered for the single core layer (a). The resulting curtain was quenched on a casting drum, and oriented in the machine direction with a roller stretcher as the stretching ratio of 4.8 times at 250° F. The resulting film was dried and oriented in the traverse direction as a stretching ratio of 4.2 times at 240° F., heat-set at 460° F., and then wound up as a biaxially oriented polyester film (A) with the thickness listed in Table 3.

One side of the biaxially oriented film was then metallized with Al to an optical density as listed in Table 3 and then wound as metallized film. In the metallizing chamber, a plasma treatment process was used to enhance the metal bond. The energy density of the treatment was approximately 1 KJ/M$^2$ and a nitrogen gas was used. The following processes were done as same as the Example 2. The properties of the films, webs and balloons are summarized in Table 4. The balloons of this Comp. Example 2 did not show extra long life, lasting less than 7 days.

Comparative Example 3

The same materials and processes as described in Example 3 were used, except no plasma treatment was applied.

The properties of the films, webs and balloons are summarized in Table 4. The balloons of this Comp. Example 3 did not show extra long life, lasting less than 14 days.

Comparative Example 4

The same materials and processes as described in Example 3 were used, except the thickness of the Polyester film (A) was 15 µm.

The properties of the films, webs and balloons are summarized in Table 4. The balloons of this Comp. Example 4 did not show extra long life, lasting less than 14 days. Typically sized balloons, such as those made from two 18 inch panels, did not display a strong buoyant force due to the low density of air and increased weight of the balloon.

Comparative Example 5

A commercially available 40 Ga (10 μm) nylon film (Biaxis BOPA) was metallized with Al and processed through the same materials as the processes. The properties of the films, webs and balloons are summarized in Table 4. The balloons of this Comp. Example 5 showed short life less than 7 days.

Examples Including Two Gas Barrier Layers

Example 8

Polyester pellets as listed in Table 2 were mixed according to the blend ratio shown in Table 5 and extruded using a vent-type two-screw extruder and filtered for the skin layer (b). Polyester pellets listed in Table 2 were also mixed according to the blend ratio shown in Table 5, dried and then extruded via extruder and filtered for the core layer (a). These melt streams were fed through a rectangular joining zone and laminated into a two layer co-extruded (a)/(b) structure. The resulting curtain was quenched on a casting drum, and oriented in the machine direction with a roller stretcher at a stretching ratio of 4.8 times at 250° F. The core layer (a) side

TABLE 2

| Pellet | Polyester | IV | Melting point degree C. | Particle Type | Shape | Size | Content |
|---|---|---|---|---|---|---|---|
| a | Polyethyleneterephthalate | 0.65 | about 260 | | No particle | | |
| b | Polyethyleneterephthalate | 0.65 | about 260 | Silica | Agglomerated | 2.6 μm (Average) | 3% |
| c | Kosa 8906C Copolyester of isophtalic acid (about 18 mol %) and terephthalic acid (about 82 mol) | 0.65 | about 209 | | No particle | | |

TABLE 3

| Example | | 2 to 5, Comp. 3 | 6 | 7 | Comp. 2, Comp. 6 | Comp. 4 |
|---|---|---|---|---|---|---|
| | Structure | (a)/(b) | (a)/(b) | (a)/(b) | (a) | (a)/(b) |
| Core layer (a) | Blend/% | Pellet a 97 Pellet b 3 | Pellet a 97 Pellet b 3 | Pellet a 97 Pellet b 3 | Pellet a 97 Pellet b 3 | Pellet a 97 Pellet b 3 |
| | Thickness/μm | 8.5 | 8.5 | 11.5 | 9 | 14.5 |
| Skin layer (b) | Blend/% | Pellet c 100 | Pellet c 95 Pellet b 5 | Pellet c 100 | | Pellet c 100 |
| | Thickness/μm | 0.5 | 0.5 | 0.5 | | 0.5 |
| Total thickness/μm | | 9 | 9 | 12 | 9 | 15 |

TABLE 4

| | | Example 2 | Example 3 | Example 4 | Example 5 | Example 6 | Example 7 | Comp. Example 2 | Comp. Example 3 | Comp. Example 4 | Comp. Example 5 |
|---|---|---|---|---|---|---|---|---|---|---|---|
| Gas barrier layer(s) (C) | Metal/Ceramic Barrier Layer | Al | Al | Al/Al | Al | Al | Al | Al | Al | Al | Al |
| | Metal OD | 2.8 | 2.8 | >3.5 | 1.6 | 2.8 | 2.8 | 2.8 | 2.8 | 2.8 | 2.5 |
| | Dry Bonding Strength (g/in) | >700 | 400 | 5/400 | 400 | 400 | 400 | 400 | 100 | 400 | 250 |
| | Wet Bonding Strength (g/in) | >30 | 3 | 1/3 | 2 | 3 | 3 | 3 | 1 | 3 | 3 |
| O2TR (cc/ 100 sqin/ day, 73 F., 0% RH) | | 0.02-0.05 | 0.02-0.07 | 0.01-0.03 | 0.05-0.09 | 0.02-0.07 | 0.02-0.09 | 0.02-0.07 | 0.02-0.07 | 0.02-0.09 | 0.02-0.09 |
| Sealing Strength | | 4.5 Kgf/in | 4.5 Kgf/in | 4.5 Kgf/in | 4.5 Kgf/in | 4 Kgf/in | 4.5 Kgf/in | 2 Kgf/in | 4.5 Kgf/in | 4.5 Kgf/in | 4.5 Kgf/in |
| Floating time (days) | | 30-35 | 20-30 | 30-35 | about 20 | about 20 | about 20 | <7 | <14 | <14 | 3-7 | of this resulting film was coated with the water base primer (D) in Table 5 by in-line coating. Subsequently, using chain driven stretcher, the film was oriented in the traverse direction at the stretching ratio of 4.2 times at 240° F., heat-set at 460° F., and then wound up as a biaxially oriented polyester film (A) with the thickness listed in Table 5. The surface of the core layer (a) was then metallized with Al to the optical density listed in Table 6 and then wound up as metallized film. Plasma treatment was done before the Al metallization. The Energy density of the treatment was approximately 1 KJ/M$^2$ and a nitrogen gas was used.

The non-metallized surface of the metallized film was corona treated and was coated with anchor coating (E) solution (Mica A-131-X) using gravure coater. The anchor (E) was dried in a convective dryer. The dried anchor surface was then coated with LLDPE sealant (B) (Dowlex 3010, 13.6 μm thick) by an extrusion coating method.

The barrier surface of the extrusion coated film was then printed on with up to 10 colors of ink, using a flexographic printing press. After the print application, the inks were fully dried in a roller convective oven to remove solvents from the ink. The printed web was cut to lengths adequate for the balloon fabrication process by rewinding on a centre driven rewinder/slitter using lay-on nip rolls to control air entrapment of the rewound roll. The slit webs were fabricated into balloons by aligning 2 or more webs into position so that the printed graphics were properly registered to each other, then adhered to each other by heat sealing (at about 400° F. for 1 second) and cut into a circle shape (17" diameter). The seam of the balloons was ⅛". A valve, as described in U.S. Pat. No. 4,917,646, was inserted into an opening and the layers abutting the valve adhered to form a complete structure. The fabricated balloons were mechanically folded along multiple axes using a mechanical process or by hand for shipping. A certain number of balloons were taken for floating time testing as previously described. The properties of the films, webs and balloons are summarized in Table 6. The balloons of this Example 8 showed an extra extra long life lasting more than 50 days.

Example 9

The same materials and processes as described in Example 8 were used, except a different gas barrier polymer for the gas barrier layer (D) was used.

The properties of the films, webs and balloons are summarized in Table 6. The balloons of this example showed extra extra long life, lasting more than 50 days.

Example 10

The same materials and processes as described in Example 8 were used, except a different gas barrier polymer for the gas barrier layer (D) was used.

The properties of the films, webs and balloons are summarized in Table 6. The balloons of this example showed extra extra long life, lasting about 50 days.

Example 11

Polyester pellets as listed in Table 2 were mixed according to the blend ratio shown in Table 5 and extruded using a vent-type two-screw extruder and filtered for the skin layer (b). Polyester pellets listed in Table 2 were mixed according to the blend ratio shown in Table 5, dried, and then extruded via extruder and filtered for the core layer (a). These melt streams were fed through a rectangular joining zone and laminated into a two layer co-extruded (a)/(b) structure. The resulting curtain was quenched on a casting drum, and oriented in the machine direction with a roller stretcher at a stretching ratio of 4.8 times at 250° F. Subsequently, using a chain driven stretcher, the film was oriented in the transverse direction at a stretching ratio of 4.2 times at 240° F., heat-set at 460° F., and then wound up as biaxially oriented polyester film (A) with the thickness listed in Table 5. The surface of the core layer (a) was metallized with Al to the optical density listed in Table 6 and then wound up as metallized film. Plasma treatment was done before the Al metallization. The energy density of the treatment was approximately 1 KJ/M$^2$ and a nitrogen gas was used.

The metallized surface of the metallized film was coated with a water solution of EVOH co-polymer with vinyl acetate (Kuraray "EXCEVAL" AQ4105) as the polymeric barrier layer (D) by a conventional gravure coater and dried in a convective dryer. The dry thickness of the barrier layer (D) was about 0.3 μm.

The following processes were done as same as the Example 8. The properties of the films, webs and balloons are summarized in Table 6. The balloons of this Example 8 showed extra extra long life lasting 40-50 days.

Examples of Long Life Clear/Translucent Balloon

Example 12

Polyester pellets as listed in Table 2 were mixed according to the blend ratio shown in Table 5 and extruded using a vent-type two-screw extruder and filtered for the skin layer (b). Polyester pellets listed in Table 2 were also mixed according to the blend ratio shown in Table 5, dried and then extruded via extruder and filtered for the core layer (a). These melt streams were fed through a rectangular joining zone and laminated into a two layer co-extruded (a)/(b) structure. The resulting curtain was quenched on a casting drum, and oriented in the machine direction with a roller stretcher at a stretching ratio of 4.8 times at 250° F. Subsequently, using chain driven stretcher, the film was oriented in the traverse direction at the stretching ratio of 4.2 times at 240° F., heat-set at 460° F., and then wound up as a biaxially oriented polyester film (A) with the thickness listed in Table 5. The surface of the core layer (a) was then deposited with AlOx as the gas barrier layer (c) and then wound up as clear gas barrier film. In the deposition chamber, a Cu seeding was performed before the AlOx deposition to enhance the bond. The contamination of the Cu was about 15 ng/cm$^2$ according to atomic absorption spectrometry.

The gas barrier layer (C) was coated with PVOH as the polymeric barrier layer (D) by a conventional gravure coater and dried in a convective dryer. The dry thickness of the barrier layer (D) was about 0.5 μm.

The non-barrier surface of the film was corona treated and was coated with anchor coating (E) solution (Mica A-131-X) using gravure coater. The anchor (E) was dried in a convective dryer. The dried anchor surface was then coated with LLDPE sealant (B) by an extrusion coating method on a matte surface chill roll. The following processes were done as same as the Example 8. The properties of the films, webs and balloons are summarized in Table 7. The balloons of this Example 8 showed extra long life lasting more than 30 days.

Example 13

The same materials and processes as described in Example 12 were used, except a mirror surface chill roll are used instead of the matte surface chill roll.

The properties of the films, webs and balloons are summarized in Table 7. The balloons of this example showed extra extra long life, lasting about 30 days.

Comparative Example 6

Polyester pellets listed in Table 2 were mixed according to the blend ratio shown in Table 3, dried, extruded via extruder, and filtered for the single core layer (a). The resulting curtain was quenched on a casting drum, and oriented in the machine direction with a roller stretcher as the stretching ratio of 4.8 times at 250° F. The resulting film was dried and oriented in the traverse direction as a stretching ratio of 4.2 times at 240° F., heat-set at 460° F., and then wound up as a biaxially oriented polyester film (A) with the thickness listed in Table 3.

The following processes were done as same as the Example 12. The properties of the films, webs and balloons are summarized in Table 7. The balloons of this Comp. Example 6 did not show extra long life, lasting less than 7 days.

Comparative Example 7

A commercially available 1 mil (23 µm) clear EVOH/Nylon extrusion film (Gunze 525 Heptax) was fabricated to the balloon. The properties of the films, webs and balloons are summarized in Table 7. The balloons of this Comp. Example 7 showed short life less than 5 days.

TABLE 7

| | | Example 12 | Example 13 | Comp. 6 | Comp. 7 |
|---|---|---|---|---|---|
| Gas barrier layer (C) | Metal/Ceramic Barrier Layer | AlOx | AlOx | AlOx | EVOH |
| Haze % | | 6 to 85 | 3 to 85 | 6 to 85 | 5 to 85 |
| Total light transmittance % | | 35 to 95 | 35 to 95 | 35 to 95 | 35 to 92 |
| Gloss at 60 degree | | 60 to 120 | 60 to 120 | 60 to 120 | 60 to 120 |
| O2TR (cc/100 sqin/day, 73 F., 0% RH) | | 0.01 | 0.01 | 0.01 | 0.03 |
| Sealing Strength | | 4.5 Kgf/in | 4.5 Kgf/in | 2 Kgf/in | 4 Kgf/in |
| Floating time (days) | | >30 | >30 | <7 | about 5 |

This application discloses several numerical ranges in the text and figures. The numerical ranges disclosed are intended to support any range or value within the disclosed numerical ranges even though a precise range limitation is not stated verbatim in the specification because this invention can be practiced throughout the disclosed numerical ranges. It is also to be understood that all numerical values and ranges set forth in this application are necessarily approximate.

The above description is presented to enable a person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the invention. Thus, this invention is not intended to be limited to the embodiments shown, but is to be accorded the widest scope consistent with the principles and features disclosed herein. Finally, the entire disclosure of the patents and publications referred in this application are hereby incorporated herein by reference.

TABLE 5

| Example | | 8 | 9 | 10 | 11 | 12 and 13 |
|---|---|---|---|---|---|---|
| Structure | | (a)/(b) | (a)/(b) | (a)/(b) | (a)/(b) | (a)/(b) |
| Core layer (a) | Blend/% | Pellet a 97 Pellet b 3 | Pellet a 97 Pellet b 3 | Pellet a 97 Pellet b 3 | Pellet a 97 Pellet b 3 | Pellet a 97 Pellet b 3 |
| | Thickness/um | 8.5 | 8.5 | 8.5 | 8.5 | 8.5 |
| Skin layer (b) | Blend/% | Pellet c 100 | Pellet c 100 | Pellet c 100 | Pellet c 100 | Pellet c 100 |
| | Thickness/um | 0.5 | 0.5 | 0.5 | 0.5 | 0.5 |
| Gas barrier layer (D) | Recipe | D1 96 part D2 4 part | D3 100 part | D4 70 part D5 30 part | D6 100 part | PVOH 100 part |
| | Solid of solution/% | 6 | 8 | 12 | 8 | |
| | Dry thickness/um | 0.05 | 0.05 | 0.05 | 0.3 | 0.5 |
| Total thickness/um | | 9 | 9 | 9 | 9.3 | 9.5 |

D1: Polyvinyl alcohol (about 90 mol %)-polyvinyl amine (about 10 mol %) copolymer
D2: Epichlorohydrin cross-linker
D3: PVOH and cross-linker, commercially available as Mica R2462 from Mica Corp
D4: EVOH, commercially available as EXCEVAL RS2117 from Kuraray
D5: PVOH, commercially available as Celvol 24-203
D6: EVOH, commercially available as EXCEVAL AQ4105 from Kuraray

TABLE 6

| | | Example 8 | Example 9 | Example 10 | Example 11 |
|---|---|---|---|---|---|
| Gas barrier layer (C) | Metal/Ceramic Barrier Layer | Al | Al | Al | Al |
| | Metal OD | 2.8 | 2.8 | 2.8 | 2.8 |
| O2TR (cc/100 sqin/day, 73 F., 0% RH) | | 0.008 | 0.008 | 0.01 | 0.015 |
| Sealing Strength | | 4.5 Kgf/in | 4.5 Kgf/in | 4.5 Kgf/in | 4.5 Kgf/in |
| Floating time (days) | | >50 | >50 | about 50 | 40-50 |

What is claimed is:

1. A balloon formed from a lamination, the lamination comprising;
   a polyester film with a total thickness of 4 μm to 12 μm comprising a biaxially oriented polyester core layer comprising high crystalline polyester and at least one amorphous copolyester skin layer;
   a sealant layer adjacent to the amorphous copolyester skin layer; and
   a ceramic gas barrier layer on an opposite side of the polyester film from the sealant layer,
   wherein an oxygen transmission rate of the balloon is less than 0.1cc/100sqin/day, a sealing strength of the balloon is more than 3.5 kg/in, a total light transmittance is more than 30% and a floating time of the balloon is more than 20 days.

2. The balloon of claim 1, wherein the sealant layer comprises a low density polyethylene.

3. The balloon of claim 1, wherein the ceramic gas barrier layer comprises AlOx or SiOx.

4. The balloon of claim 1, further comprising an anchor layer between the sealant layer and the amorphous copolyester skin layer.

5. The balloon of claim 1, further comprising a primer layer between the biaxially oriented core layer and the ceramic gas barrier layer.

6. The balloon of claim 1, wherein the biaxially oriented core layer is co-extruded with the amorphous copolyester skin layer.

7. The balloon of claim 1, wherein the amorphous copolyester skin layer has a melting point of less than 210° C.

8. The balloon of claim 1, the amorphous copolyester skin layer contains no added particles.

9. The balloon of claim 1, wherein a haze of the lamination is less than 90%.

10. The balloon of claim 1, further comprising a second gas barrier layer on the ceramic gas barrier layer.

11. The balloon of claim 10, wherein the second gas barrier layer comprises a polymer.

12. The balloon of claim 10, wherein the second gas barrier layer comprises an ethylene-vinyl alcohol polymer, a poly vinyl alcohol polymer, or a poly vinyl amine copolymer.

13. The balloon of claim 11, wherein the second gas barrier further comprises at least one cross-linker.

14. The balloon of claim 10, wherein the floating time of the balloon is more than 30 days.

* * * * *